(12) United States Patent
In et al.

(10) Patent No.: US 10,706,932 B2
(45) Date of Patent: Jul. 7, 2020

(54) MEMORY DEVICE AND OPERATING METHOD THEREOF

(71) Applicant: SK hynix Inc., Gyeonggi-do (KR)

(72) Inventors: Eun Kyu In, Gyeonggi-do (KR); Jae Woo Park, Gyeonggi-do (KR); Seok Won Park, Seoul (KR); Byung Ryul Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/858,394

(22) Filed: Dec. 29, 2017

(65) Prior Publication Data

US 2019/0035468 A1    Jan. 31, 2019

(30) Foreign Application Priority Data

Jul. 27, 2017  (KR) .................. 10-2017-0095725

(51) Int. Cl.
| | |
|---|---|
| *G11C 16/08* | (2006.01) |
| *G11C 16/04* | (2006.01) |
| *G11C 16/32* | (2006.01) |
| *G11C 8/18* | (2006.01) |
| *G11C 16/24* | (2006.01) |

(52) U.S. Cl.
CPC .......... *G11C 16/08* (2013.01); *G11C 16/0408* (2013.01); *G11C 8/18* (2013.01); *G11C 16/0483* (2013.01); *G11C 16/24* (2013.01); *G11C 16/32* (2013.01)

(58) Field of Classification Search
None
See application file for complete search history.

(56) References Cited

U.S. PATENT DOCUMENTS

| | | | | |
|---|---|---|---|---|
| 5,313,437 | A * | 5/1994 | Toda | G11C 7/1018 365/230.03 |
| 5,659,517 | A * | 8/1997 | Arimoto | G11C 5/14 365/226 |
| 6,529,442 | B1 * | 3/2003 | Wilcox | G11C 8/18 365/227 |

FOREIGN PATENT DOCUMENTS

KR    1020160075006    6/2016

* cited by examiner

*Primary Examiner* — James G Norman
(74) *Attorney, Agent, or Firm* — IP & T Group LLP

(57) ABSTRACT

A memory device prevents generation of an abnormal column address. The memory device includes: a memory cell array; and a column address controller configured to generate a column address of the memory cell array in response to a column address control signal, wherein the column address controller enables the column address control signal when an address signal is input, and wherein the address signal includes a column address signal corresponding to the column address.

18 Claims, 10 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2017-0095725, filed on Jul. 27, 2017, the entire disclosure of which is herein incorporated by reference.

BACKGROUND

Field of Invention

An aspect of the present disclosure relates to an electronic device, more particularly, to a memory device and an operating method thereof.

Description of Related Art

A memory device is a storage device implemented using a semiconductor such as silicon (Si), germanium (Ge), gallium arsenide (GaAs), or indium phosphide (InP). The memory device is generally classified into a volatile memory device and a nonvolatile memory device.

Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

SUMMARY

Embodiments provide a memory device that prevents generation of an abnormal column address and an operating method for the memory device.

According to an aspect of the present disclosure, there is provided a memory device including: a memory cell array; and a column address controller configured to generate a column address of the memory cell array in response to a column address control signal, wherein the column address controller enables the column address control signal when an address signal is input, and wherein the address signal includes a column address signal corresponding to the column address.

According to an aspect of the present disclosure, there is provided a memory device including: a memory cell array; and a control logic configured to receive a command signal instructing performance of an operation on selected memory cells among the plurality of memory cells from an external controller and an address signal indicating positions of the selected memory cells, wherein the control logic includes a column address controller configured to generate a column address of the memory cell array when a column address signal, which corresponds to the column address and is included in the address signal, is input.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
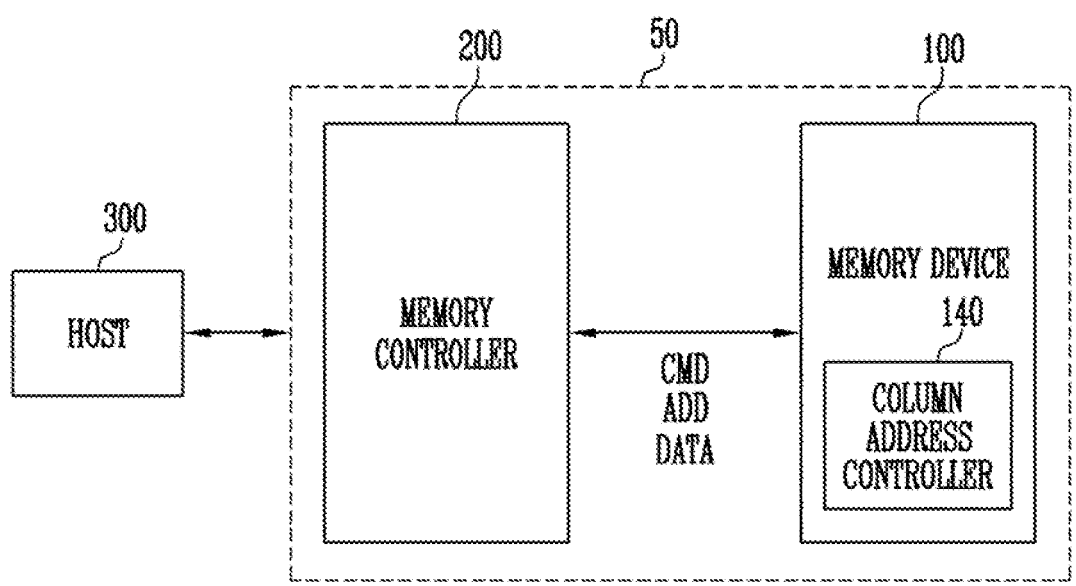
FIG. 1 is a diagram illustrating a storage device including a memory device according to an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Furthermore, other expressions describing relationships between components such as "between," "immediately between" or "adjacent to" and "directly adjacent to" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that are commonly understood by those skilled in the art to which the present disclosure pertains. Terms having definitions defined in the dictionary should be understood such that they have meanings consistent within the context of the related technique. As far as not being clearly defined in this application, terms should not be interpreted in an ideally or excessively formal way.

In describing the embodiments, description will be omitted for techniques that are well known to the art to which the present disclosure pertains, and are not directly related to the present disclosure. The intention is to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a diagram illustrating a storage device including a memory device according to an embodiment of the present disclosure.

Referring to FIG. 1, the storage device 50 may include a memory device 100 and a memory controller 200.

The memory device 100 may store data. The memory device 100 operates in response to the control of the memory controller 200. The memory device 100 may include a memory cell array including a plurality of memory cells that store data.

The memory cell array may include a plurality of memory blocks. Each memory block may include a plurality of memory cells. The memory device 100 may sequentially or randomly store data in the memory blocks according to the control of the memory controller 200.

In an embodiment, the memory device 100 may be a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like. In addition, the memory device 200 of the present disclosure may be implemented in a three-dimensional array structure.

In an embodiment, the memory device may be implemented in a three-dimensional structure. The present disclosure may be applied to not only a flash memory device in which a charge storage layer is configured with a floating gate (FG) but also a charge trap flash (CTF) in which a charge storage layer is configured with an insulating layer.

The memory device 100 may receive a command CMD, an address ADD, and data DATA from the memory controller 200. The memory device 100 may perform an operation corresponding to the command CMD on a region selected by the address ADD received from the memory controller 200.

For example, the memory device 100 may perform a write operation that is, program operation, a read operation, and an erase operation. In the program operation, the memory device 100 may program data in the region selected by the address. In the read operation, the memory device 100 may read data from the region selected by the address. In the erase operation, the memory device 100 may erase data stored in the region selected by the address.

The address ADD provided to the memory device 100 by the memory controller 200 is a signal indicating a position of a region of selected memory cells among the plurality of memory cells included in the memory device 100. In an embodiment, the address ADD may include signals respectively corresponding to a row address RA indicating positions of the selected memory cells in a row direction and a column address CA indicating positions of the selected memory cells in a column direction. In an embodiment, the address ADD may further include signals respectively corresponding to a logical unit number LUN of the memory device, a plane address PA indicating a plane to which the selected memory cells belong, and a block address BA indicating a position of a memory block in which the selected memory cells are included.

The memory device 100 according to the embodiment of the present disclosure may further include a column address controller 140.

The column address controller 140 may generate a column address, based on the received address ADD. The column address controller 140 may generate control signals for acquiring column address signals corresponding to the column address included with the address ADD, and acquire the column address signals from the address ADD by using the control signals. The column address controller 140 may generate the column address by using the acquired column address signals.

A method for generating, by the column address controller 140, the column address according to an embodiment of the present disclosure will be described in more detail with reference to FIGS. 7 and 8.

The memory controller 200 may control overall operations of the memory device 100. The memory controller 200 may control an operation of the memory device 100 according to a request of a host 300 or regardless of the request of the host 300.

For example, the memory controller 200 may control the memory device 100 to perform a program operation, a read operation, an erase operation, or the like according to the request of the host 300. In the program operation, the memory controller 200 may provide a program command, a physical address, and data to the memory device 100. In the read operation, the memory controller 200 may provide a read command and a physical address to the memory device 100. In the erase operation, the memory controller 200 may provide an erase command and a physical address to the memory device 100.

In an embodiment, the memory controller 200 may autonomously generate a program command, an address, and data and transmit them to the memory device 100, without a request from the host 300. For example, the memory controller 200 may provide a command, an address, and data to the memory device 100 so as to perform background operations such as a program operation for wear leveling and a program operation for garbage collection.

The memory controller 200 may execute firmware (FW) for controlling the memory device 100. When the memory device 100 is a flash memory device, the memory controller 200 may be configured to operate firmware such as a flash translation layer (FTL) for controlling communication between the host 300 and the memory device 100. Specifically, the memory controller 200 may translate a logical address included in the request from the host 300 into a physical address that is the address ADD to be provided to the memory device 100.

Although not shown in the drawing, the memory device 100 may exchange a control signal CTRL with the memory controller 200. For example, the memory device 100 may receive, from the memory controller 200, at least one of a chip select signal /CE indicating that the memory device 100 has been selected, a command latch enable signal CLE indicating that a signal received from the memory controller 200 is the command CMD, an address latch enable signal ALE indicating that a signal received from the memory controller 200 is the address ADD, a read enable signal /RE that is generated by the memory controller 200 in a read operation and is periodically toggled to be used to adjust a timing, a write enable signal /WE activated by the memory controller 200 when the command CMD or the address ADD is transmitted, a write preventing signal /WP activated by the memory controller 200 to prevent an unwanted erase or an unwanted write when power supply is changed, and a data strobe signal DQS that is generated by the memory controller 200 in a program operation and is periodically toggled to be used to adjust an input sync of the data DATA.

In an embodiment, the memory device 100 may output, to the memory controller 200, at least one of a ready & busy signal R/nB indicating whether the memory device 100 is performing any one operation among program, erase, and read operations and a data strobe signal DQS that is generated from the read enable signal /RE received from the memory controller 200 by the memory device 100 and is periodically toggled to be used to adjust an output sync of the data DATA.

The host 300 may communicate with the storage device 50, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), and the like.

Figure 2:
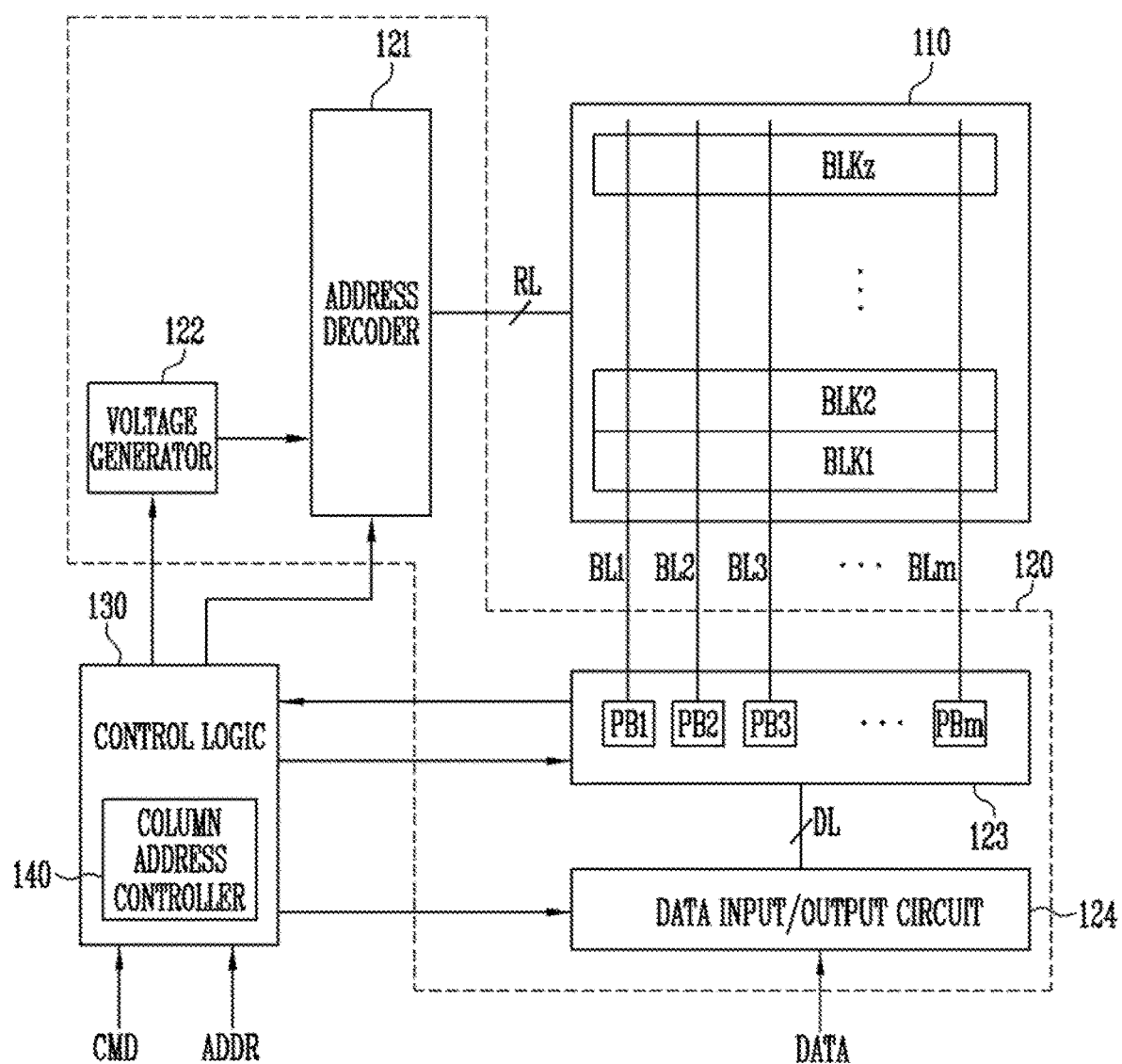
FIG. 2 is a diagram illustrating a structure of the memory device shown in FIG. 1.

FIG. 2 is a diagram illustrating a structure of the memory device 100 of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells. Among the plurality of memory cells, memory cells coupled to the same word line are defined as one page. That is, the memory cell array 110 is configured with a plurality of pages. In an embodiment, each of the plurality of memory blocks BLK1 to BLKz included in the memory cell array 110 may include a plurality of dummy cells. One or more dummy cells may be coupled in series between a drain select transistor and memory cells, and between a source select transistor and memory cells.

Each of the memory cells of the memory device 100 may be configured as a single level cell (SLC) for storing one bit of data, a multi-level cell (MLC) for storing two bits of data, a triple level cell (TLC) for storing three bits of data, or a quad level cell (QLC) for storing four bit of data.

The peripheral circuit 120 may include the address decoder 121, a voltage generator 122, the read/write circuit 123, and a data input/output circuit 124.

The peripheral circuit 120 drives the memory cell array 110. For example, the peripheral circuit 120 may drive the memory cell array 120 to perform program, read, and erase operations.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to operate in response to the control of the control logic 130. The address decoder 121 receives an address ADDR from the control logic 130.

The address decoder 121 is configured to decode a block address in the received address ADDR. The address decoder 121 selects at least one memory block among the memory blocks BLK1 to BLKz according to the decoded block address. The address decoder 121 is configured to decode a row address in the received address ADDR. The address decoder 121 may select at least one word line WL of the selected memory block by applying voltages provided from the voltage generator 122 to the word line WL according to the decoded row address.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line, and apply a pass voltage higher than the read voltage to the unselected word lines.

In an embodiment, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In an embodiment, the address decoder 121 may be configured to decode a column address in the address ADDR transmitted thereto. The decoded column address DCA may be transmitted to the read/write circuit 123. In an exemplary embodiment, the address decoder 121 may include components such as a row decoder, a column decoder, and an address buffer.

The voltage generator 122 is configured to generate a plurality of voltages by using an external power voltage supplied to the memory device 100. The voltage generator 122 operates in response to the control of the control logic 130.

In an embodiment, the voltage generator 122 may generate an internal power voltage by regulating the external power voltage. The internal power voltage generated by the voltage generator 122 is used as an operating voltage of the semiconductor memory device 100.

In an embodiment, the voltage generator 122 may generate a plurality of voltages by using the external power voltage or the internal power voltage. The voltage generator 122 may be configured to generate various voltages required by the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal power voltage, and generate a plurality of voltages by selectively activating the plurality of pumping capacitors in response to the control of the control logic 130.

The plurality of generated voltages may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate in response to the control of the control logic 130.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transmit, to selected memory cells, the data DATA to be stored, which is received through the data input/output circuit 124, when a program pulse is applied to a selected word line. The memory cells of the selected page may be programmed according to the transmitted data DATA. A memory cell coupled to a bit line to which a program permission voltage for example, a ground voltage is applied may have an increased threshold voltage. The threshold voltage of a memory cell coupled to a bit line to which a program prohibition voltage for example, a power voltage is applied, may be maintained. In a program verify operation, the first to mth page buffers PB1 to PBm read page data from the selected memory cells through the bit lines BL1 to BLm.

In a read operation, the read/write circuit 123 reads data DATA from memory cells of a selected page through the bit lines BL, and outputs the read data DATA to the data input/output circuit 124.

In an erase operation, the read/write circuit 123 may allow the bit lines BL to be floated. In an embodiment, the read/write circuit 123 may include a column select circuit.

The data input/output circuit 124 is coupled to the first to mth page buffers PB1 to PBm through the data lines DL. The data input/output circuit 124 operates in response to the control of the control logic 130.

The data input/output circuit 124 may include a plurality of input/output buffers (not shown) that receive input data. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

The control logic 130 may be coupled to the address decoder 121, the voltage generator 122, the read/write circuit 123, and the data input/output circuit 124. The control logic 130 may be configured to control overall operations of the memory device 100. The control logic 130 may operate in response to a command CMD transmitted from an external device.

Referring to FIG. 2, the column address controller 140 may be provided in the control logic 130. The column address controller 140 may generate a column address from an address ADDR input thereto, and provide the generated column address to the address decoder 121 or the column select circuit included in the read/write circuit 123.

In an embodiment, the address ADDR received by the control logic 130 may be the same as the address ADD described with reference to FIG. 1. The address ADDR received by the control logic 130 is a signal indicating a position of a region of selected memory cells among the plurality of memory cells included in the memory cell array 110. In an embodiment, the address ADDR may include signals respectively corresponding to a row address RA indicating positions of the selected memory cells in a row direction and a column address CA indicating positions of the selected memory cells in a column direction. In an embodiment, the address ADDR may further include signals respectively corresponding to a logical unit number LUN of the memory device, a plane address PA indicating a plane to which the selected memory cells belong, and a block address BA indicating a position of a memory block in which the selected memory cells are included.

The column address controller 140 may generate a column address, based on the received address ADDR. The column address controller 140 may generate control signals for acquiring column address signals corresponding to the column address included in the address ADDR, and acquire the column address signals from the address ADDR by using the control signals. The column address controller 140 may generate the column address by using the acquired column address signals.

A method for generating, by the column address controller 140, the column address according to an embodiment of the present disclosure will be described in more detail with reference to FIGS. 7 and 8.

Figure 3:
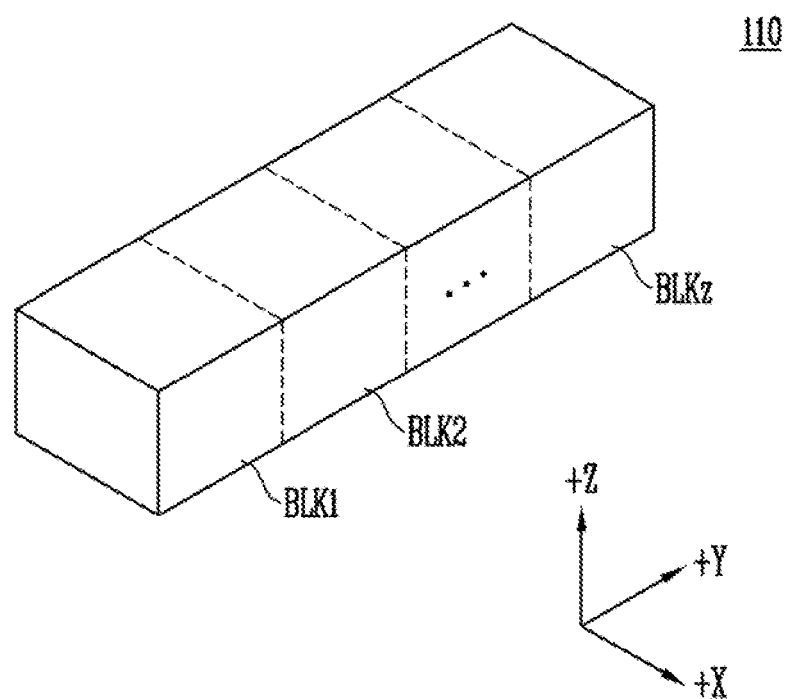
FIG. 3 is a diagram illustrating an embodiment of a memory cell array shown in FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. The plurality of memory cells are arranged along +X, +Y, and +Z directions. A structure of each memory block will be described in more detail with reference to FIGS. 4 and 5.

Figure 4:
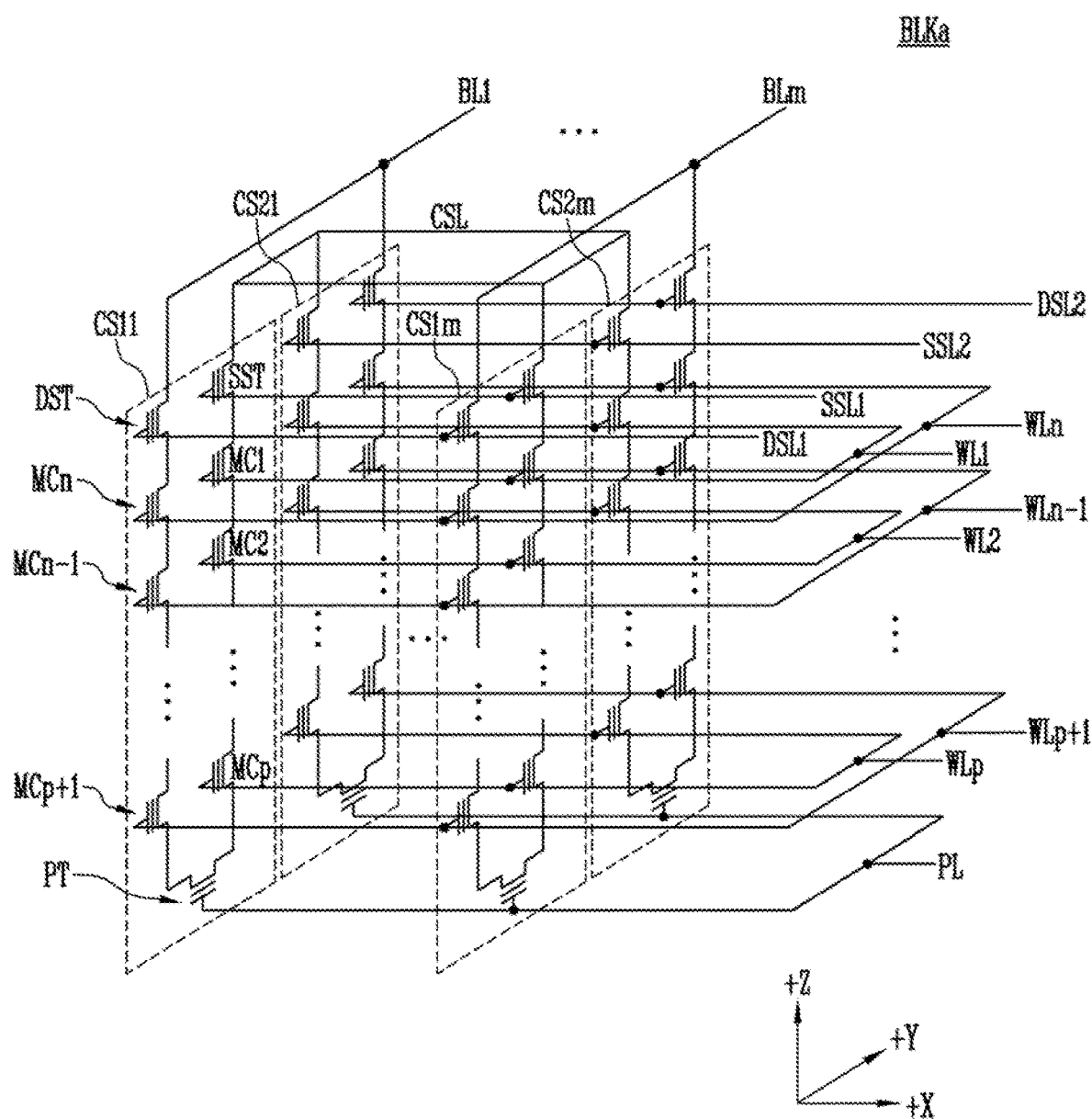
FIG. 4 is a circuit diagram illustrating one memory block among memory blocks shown in FIG. 3.

FIG. 4 is a circuit diagram illustrating one memory block BLKa among the memory blocks BLK1 to BLKz of FIG. 3.

Referring to FIG. 4, the memory block BLKa includes a plurality of cell strings CS11 to CS1*m* and CS21 to CS2*m*.

In an embodiment, each of the plurality of cell strings CS11 to CS1m and CS21 to CS2m may be formed in a 'U' shape. In the memory block BLKa, m cell strings are arranged in a row direction that is, a +X direction. In FIG. 4, it is illustrated that two cell strings are arranged in a column direction that is, a +Y direction. However, this is for convenience of description, and it will be understood that three cell strings may be arranged in the column direction.

Each of the plurality of cell strings CS11 to CS1m and CS21 to CS2m includes at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. As a larger number of dummy memory cells are provided, the reliability of an operation of the memory block BLKa is improved, however, the size of the memory block BLKa is increased. As a smaller number of dummy memory cells are provided, the size of the memory block BLKa is decreased, however, the reliability of an operation of the memory block BLKa may be deteriorated.

To efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
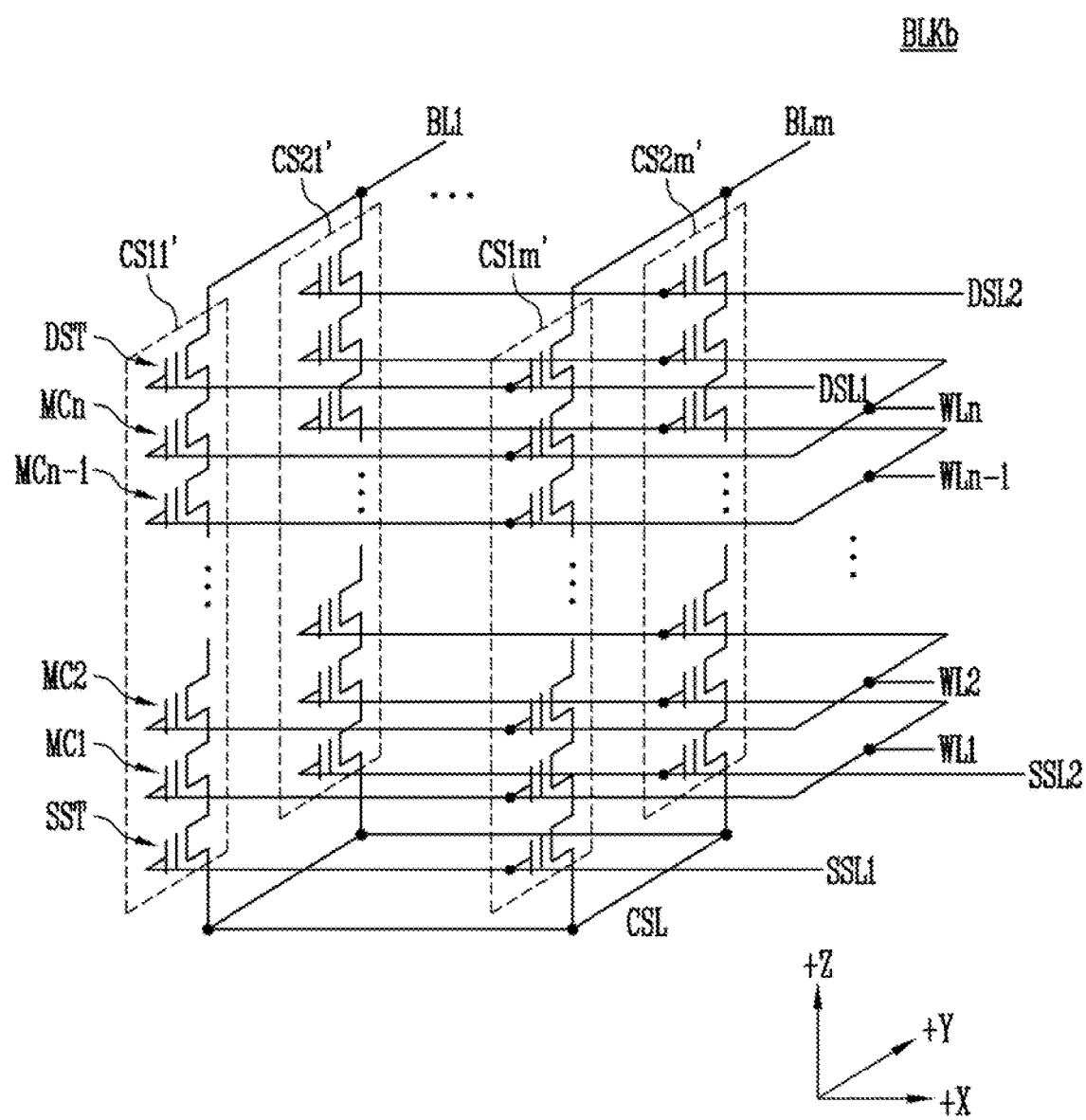
FIG. 5 is a circuit diagram illustrating another embodiment of the one memory block among the memory blocks shown in FIG. 3.

FIG. 5 is a circuit diagram illustrating another embodiment BLKb of the one memory block BLKa among the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has an equivalent circuit similar to that of the memory block BLKa of FIG. 4, except that the pipe transistor PT is excluded from each cell string.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. As a larger number of dummy memory cells are provided, the reliability of an operation of the memory block BLKb is improved, however, the size of the memory block BLKb is increased. As a smaller number of dummy memory cells are provided, the size of the memory block BLKb is decreased, however, the reliability of an operation of the memory block BLKb may be deteriorated.

To efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
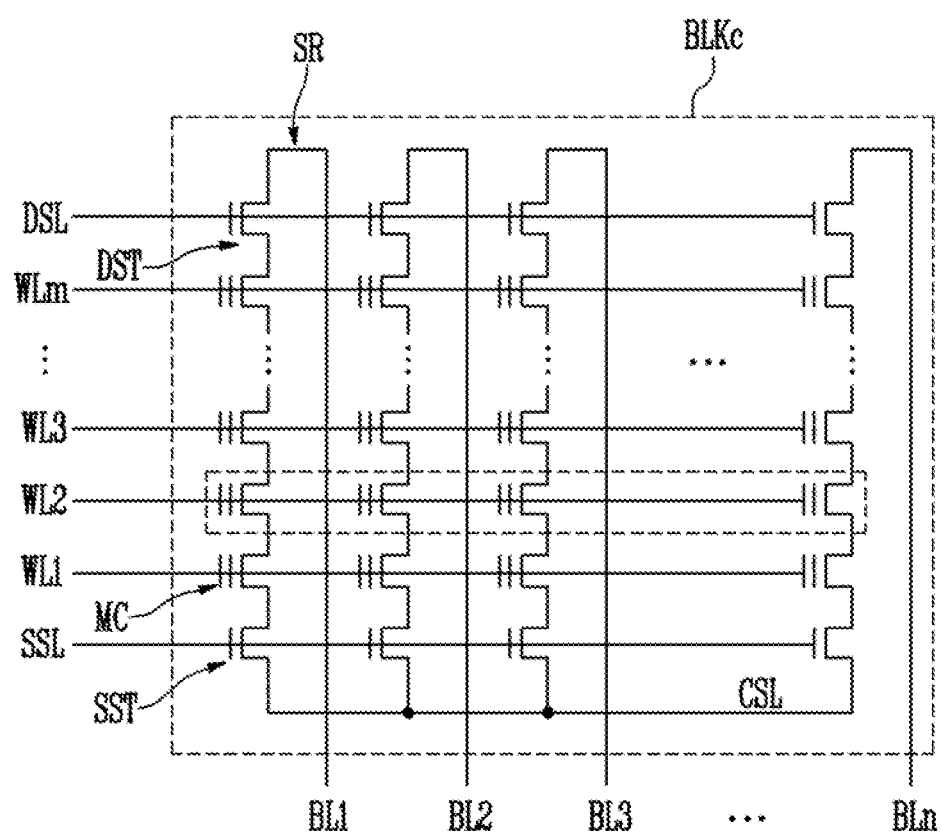
FIG. 6 is a circuit diagram illustrating an embodiment of one memory block among a plurality of memory blocks included in the memory cell array shown in FIG. 2.

FIG. 6 is a circuit diagram illustrating an embodiment of one memory block BLKc among the plurality of memory blocks BLK1 to BLKz included in the memory cell array 110 of FIG. 2.

Referring to FIG. 6, the memory block BLKc includes a plurality of strings SR. The plurality of strings SR may be coupled to a plurality of bit lines BL1 to BLn, respectively. Each string SR includes a source select transistor SST, memory cells MC, and a drain select transistor DST.

The source select transistor SST of each string SR is coupled between the memory cells MC and a common source line CSL. The source select transistors SST of the plurality of strings SR are commonly coupled to the common source line CSL.

The drain select transistor DST of each string SR is coupled between the memory cells MC and a bit line BL. The drain select transistors DST of the plurality of strings SR are coupled to the plurality of bit lines BL1 to BLn, respectively.

In each string SR, a plurality of memory cells MC are provided between the source select transistor SST and the drain select transistor DST. In each string SR, the plurality of memory cells MC may be coupled in series.

In the plurality of strings SR, memory cells MC located at the same positions from the common source line CSL may be commonly coupled to one word line. The memory cells MC of the plurality of strings SR may be coupled to a plurality of word lines WL1 to WLm.

In the memory block BLKc, an erase operation may be performed in units of memory blocks. When the erase operation is performed in units of memory blocks, all of the memory cells of the memory block BLKc may be simultaneously erased according to one erase request.

Figure 7:
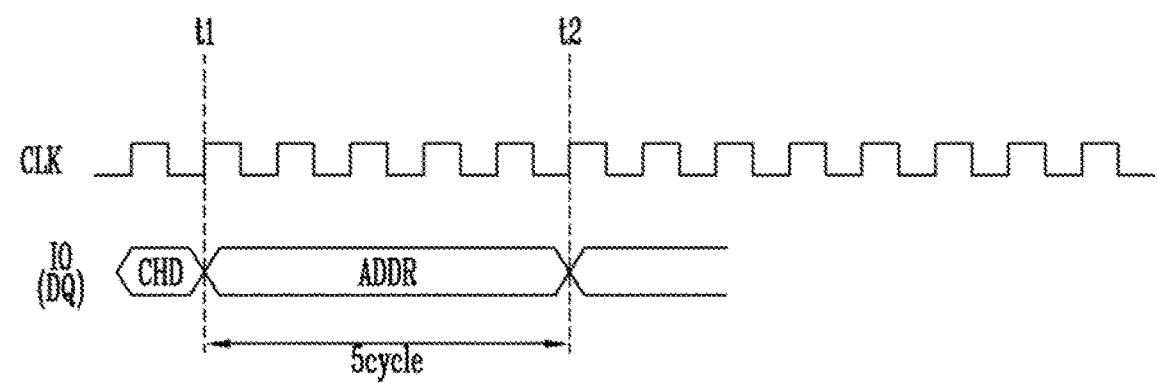
FIG. 7 is a diagram illustrating an address signal input to the memory device.
Figure 7:

FIG. 7 is a diagram illustrating an address signal input to the memory device 100.

Referring to FIG. 7, the memory device 100 may receive an address ADDR through input/output pads 10 according to a reference clock CLK. In an embodiment, the reference clock CLK may be input from the outside of the memory device 100, or be generated in the memory device 100.

In FIG. 7, the address ADDR may be input in section between time points t1 and t2. Before time t1, a command CMD may be in a state in which it has already been input. The input command may be any one of a program command and a read command.

The address ADDR may be input during five cycles of the reference clock CLK.

The address ADDR input during five cycles is a signal indicating a position of a region of selected memory cells among the plurality of memory cells included in the memory device 100. In an embodiment, the address ADDR may include signals respectively corresponding to a row address RA indicating positions of the selected memory cells in a row direction and a column address CA indicating positions of the selected memory cells in a column direction. In an embodiment, the address ADDR may further include signals respectively corresponding to a logical unit number LUN of the memory device, a plane address PA indicating a plane to which the selected memory cells belong, and a block address BA indicating a position of a memory block in which the selected memory cells are included.

Specifically, the address ADDR may be input during five cycles CYCLE1 to CYCLE5 of the reference clock CLK. A first column address signal CA1 corresponding to the column address may be input during a first cycle CYCLE1, and a second column address signal CA2 corresponding to the column address may be input during a second cycle CYCLE2.

Signals respectively corresponding to a logical unit number LUN of the memory device, a plane address PA indicating a plane to which the selected memory cells belong, and a block address BA indicating a position of a memory block in which the selected memory cells are included, and a row address RA indicating positions of the selected memory cells in a row direction may be input during third to fifth cycles CYCLE3 to CYCLE5.

Therefore, the column address controller 140 described with reference to FIGS. 1 and 2 may generate a column address CA, using the first column address signal CA1 and the second column address signal CA2, which are input during the first and second cycles CYCLE1 and CYCLE2.

If an address is input to the memory device 100, the memory device 100 generates an address control signal CI_ALEBUS<2:0> configured with a bit string of three bits. The address control signal CI_ALEBUS<2:0> may be a control signal indicating one among the five cycles CYCLE1 to CYCLE5 corresponding to a currently input address. For example, the address control signal CI_ALEBUS<2:0> may have a value that is increased by 1 whenever the cycle of the reference clock CLK is changed. Specifically, the address control signal CI_ALEBUS<2:0> may have a value of "000" during the first cycle, have a value of "001" during the second cycle, have a value of "010" during the third cycle, have a value of "011" during the fourth cycle, and have a value of "100" during the fifth cycle. After the address ADDR is entirely input, the address control signal CI_ALEBUS<2:0> may be initialized to have the value of "000."

Typically, a memory device generates a column address, using the address control signal CI_ALEBUS<2:0>. For example, a typical memory device generates a column address, using the address ADDR input when the address control signal CI_ALEBUS<2:0> has the value of "000" and the address ADDR input when the address control signal CI_ALEBUS<2:0> has the value of "001." However, the value of "000" or "001" may be instantaneously exhibited while the value of the address control signal CI_ALEBUS<2:0> is being changed from the value of "011" to the value of "100" due to a delicate difference between transition time gaps of the bits of the address control signal CI_ALEBUS<2:0>. Therefore, there may occur a problem in that the column address is reset in sections except the section in which the signals corresponding to the column address are input.

The memory device 100 according to the embodiment of the present disclosure generates a column address control signal EN that is a control signal for setting a column address. The column address control signal EN may be a control signal instructing generation of a column address. For example, when the column address control signal EN is in an enable state, the memory device 100 may generate a column address.

In various embodiments, the column address control signal EN may be generated based on the address control signal CI_ALEBUS<2:0>. For example, the column address control signal EN may be a signal that is enabled only when the address control signal CI_ALEBUS<2:0> has the value of "001" and is disabled when the address control signal CI_LALEBUS<2:0> has a value except "001."

Alternatively, in an embodiment, the column address control signal EN may be a control signal generated according to an internal signal activated only when the second column address signal CA2 is input from the control logic 130 described with reference to FIG. 2.

The memory device 100 according to the embodiment of the present disclosure may generate the column address CA by using the first column address signal CA1 and the second column address signal CA2, which have already been received, in response to the enable state of the column address control signal EN.

Figure 8:
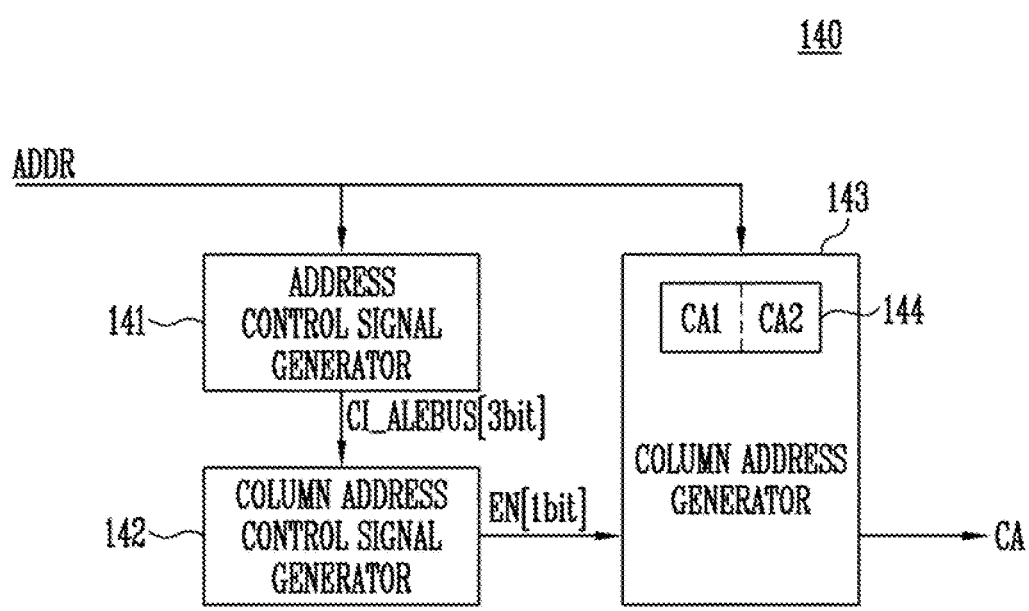
FIG. 8 is a diagram illustrating a structure of a column address controller shown in FIG. 2.

FIG. 8 is a diagram illustrating a structure of the column address controller 140 of FIG. 1 or 2.

Referring to FIG. 8, the column address controller 140 may include an address control signal generator 141, a column address control signal generator 142, and a column address generator 143.

The column address generator 143 may include a column address signal storage unit 144.

The address control signal generator 141 may receive an address signal ADDR and generate an address control signal CI_ALEBUS[3 bit] in response to the received address signal ADDR. When assuming that the address ADDR may be input during five cycles CYCLE1 to CYCLE5 of the reference clock CLK, the address control signal CI_ALEBUS[3 bit] may be a control signal indicating one among the five cycles corresponding to a currently input address. For example, the address control signal CI_ALEBUS[3 bit] may have a value that is increased by 1 whenever the cycle of the reference clock CLK is changed. Specifically, the address control signal CI_ALEBUS[3 bit] may have a value of "000" during the first cycle, have a value of "001" during the second cycle, have a value of "010" during the third cycle, have a value of "011" during the fourth cycle, and have a value of "100" during the fifth cycle. The address control signal generator 141 may be initialized such that the address control signal CI_ALEBUS[3 bit] has the value of "000" after the address signal ADDR is entirely input. The address control signal generator 141 may provide the generated address control signal CI_ALEBUS[3 bit] to the column address control signal generator 142.

The column address control signal generator 142 may generate a column address control signal EN[1 bit] that is a control signal for setting a column address. The column address control signal generator 142 may receive the address control signal CI_ALEBUS[3 bit] from the address control signal generator 141, and generate a column address control signal EN[1 bit] according to a value of the received address control signal CI_ALEBUS[3 bit]. The column address control signal EN[1 bit] may be a control signal instructing generation of a column address. For example, when the column address control signal EN[1 bit] is in the enable state, the column address generator 143 may generate a column address CA.

In an embodiment, the column address control signal EN[1 bit] may be a signal that is enabled only when the column address 20) control signal EN[1 bit] has the value of "001" and is disabled when the column address control signal EN[1 bit] has a value except "001."

In another embodiment, although not shown in the drawing, the column address control signal generator 142 may generate the column address control signal EN[1 bit] according to an internal signal activated only when the second column address signal CA2 is input from the control logic 130 described with reference to FIG. 2.

The column address control signal controller 142 may provide the generated column address control signal EN[1 bit] to the column address generator 143.

The column address generator 143 may receive the address signal ADDR and the column address control signal EN[1 bit]. The column address generator 143 may generate a column address signal from the address signal ADDR, in response to the column address control signal EN[1 bit].

When the address signal ADDR is input during five cycles CYCLE1 to CYCLE5 of the reference clock CLK as above, a first column address signal CA1 corresponding to the column address CA may be input during a first cycle CYCLE1, and a second column address signal CA2 corresponding to the column address CA may be input during a second cycle CYCLE2. In an embodiment, the column address generator 143 may receive the first column address signal CA1 and the second column address signal CA2.

The column address generator 143 may store the first column address signal CA1 and the second column address signal CA2 in the column address signal storage unit 144.

When the column address control signal EN[1 bit] is in the enable state, the column address generator 143 may generate the column address CA by using the first column address signal CA1 and the second column address signal CA2. Specifically, the column address generator 143 may generate the column address CA obtained by combining the first column address signal CA1 and the second column address signal CA2.

According to the embodiment of the present disclosure, the column address generator 143 generates the column address CA according to the column address control signal EN[1 bit] instead of the address control signal CI_ALEBUS[3 bit]. Since the column address control signal EN[1 bit] is a signal that is enabled during only the second cycle among the five cycles of the reference clock CLK, in which the address signal ADDR is input, it is possible to prevent the problem in that the column address is reset in sections except the section in which the signals corresponding to the column address are input, which may occur when the column address CA is generated according to the address control signal CI_ALEBUS[3 bit] generated in the entire section in which the address signal ADDR is input.

Figure 9:
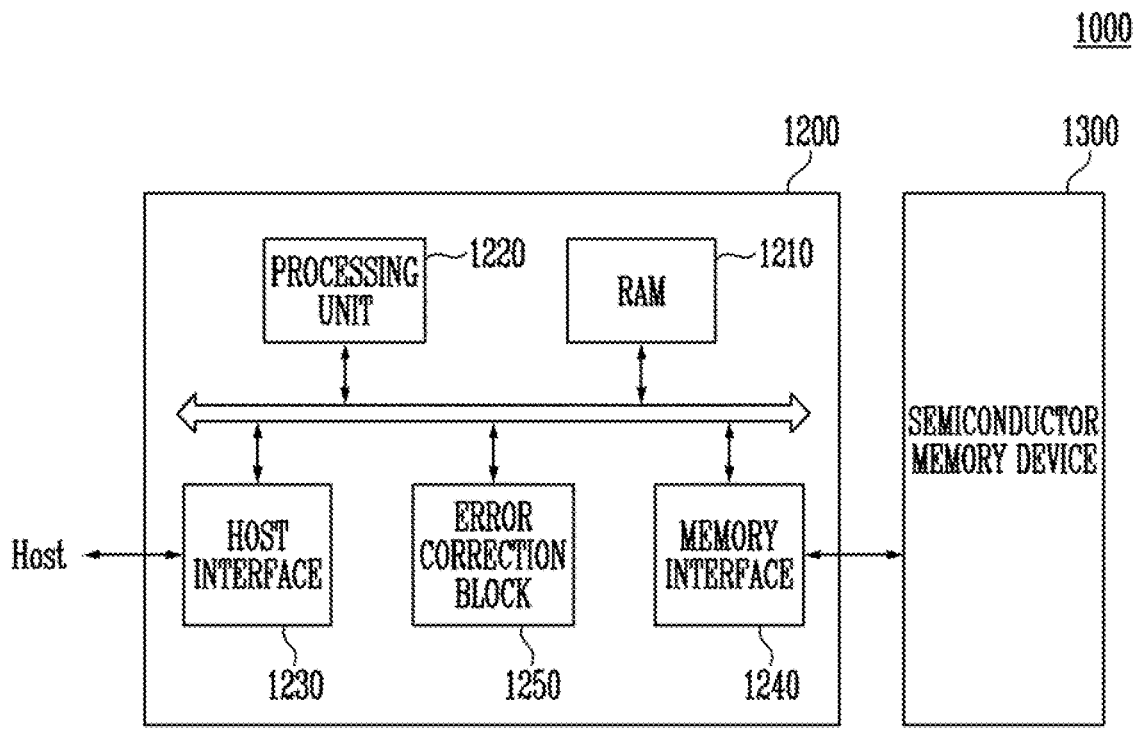
FIG. 9 is a block diagram illustrating another embodiment of the storage device shown in FIG. 1.

FIG. 9 is a block diagram illustrating another embodiment of the storage device of FIG. 1.

Referring to FIG. 9, the storage device 1000 includes a semiconductor memory device 1300 and a controller 1200.

The semiconductor memory device 1300 may be configured and operated identically to the memory device 100 described with reference to FIG. 1. The controller 1200 may be configured and operated identically to the memory controller 200 described with reference to FIG. 1. Hereinafter, overlapping descriptions will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the semiconductor memory device 1300 and the host Host. The controller 1200 is configured to drive firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host Host, and a buffer memory between the semiconductor memory device 1300 and the host Host.

The processing unit 1220 controls overall operations of the controller 1200. The processing unit 1220 is configured to control read, program, erase, and background operations of the semiconductor memory device 1300. The processing unit 1220 is configured to drive firmware for controlling the semiconductor memory device 1300. The processing unit 1220 may perform a function of a flash translation layer (FTL). The processing unit 1220 may convert a logical block address (LBA) provided by the host into a PBA through the FTL. The FTL may receive an LBA using a mapping table, to convert the LBA into a PBA. There are various address mapping methods of the FTL according to mapping units. Representative address mapping methods include a page mapping method, a block mapping method, and a hybrid mapping method.

The processing unit 1220 is configured to randomize data received from the host Host. For example, the processing unit 1220 may randomize the data received from the host Host by using a randomizing seed. The randomized data is provided as data to be stored to the semiconductor memory device 1300, to be programmed in a memory cell array.

The processing unit 1220 is configured to derandomize data received from the semiconductor memory device 1300 when a read operation is performed. For example, the processing unit 1220 may derandomize the data received from the semiconductor memory device 1300 by using a derandomizing seed. The derandomized data may be output to the host Host.

In an embodiment, the processing unit 1220 may perform randomizing and derandomizing by driving software or firmware.

The host interface 1230 includes a protocol for exchanging data between the host Host and the controller 1200. In an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 1300. For example, the memory interface 1240 may include a NAND interface or a NOR interface.

The error correction block 1250 is configured to detect and correct an error of data received from the semiconductor memory device 1300 by using an error correction code (ECC). The error correction block 1250 may correct an error with respect to read page data by using the ECC. The error correction block 1250 may correct an error by using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation, Hamming code, etc.

The controller 1200 and the semiconductor memory device 1300 may be integrated into one semiconductor device. In an exemplary embodiment, the controller 1200 and the semiconductor memory device 1300 may be integrated into one semiconductor device, to constitute a memory card. For example, the controller 1200 and the semiconductor memory device 1300 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 1300 may be integrated into one semiconductor device to constitute a semiconductor drive (solid state drive (SSD)). The semiconductor drive SSD includes a storage device configured to store data in a semiconductor memory.

If the storage device 1000 is used as the semiconductor drive SSD, the operating speed of the host coupled to the storage device 1000 can be remarkably improved.

As another example, the storage device 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, or one of various components that constitute a computing system.

In an exemplary embodiment, the semiconductor memory device 1300 or the storage device 1000 may be packaged in various forms. For example, the semiconductor memory device 1300 or the storage device 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 10:
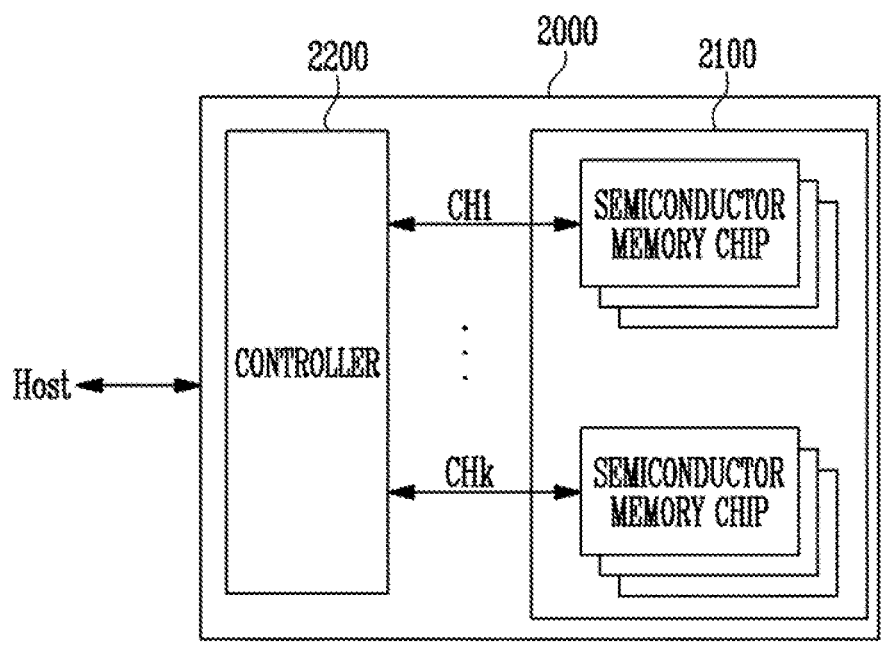
FIG. 10 is a block diagram illustrating an application example of the storage device shown in FIG. 9.

FIG. 10 is a block diagram illustrating an application example 2000 of the storage device of FIG. 9.

Referring to FIG. 10, the storage device 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 10, it is illustrated that the plurality of groups communicate with the controller 2200 through first to kth channels CH1 to CHk. Each semiconductor memory chip may be configured and operated identically to the memory device 100 described with reference to FIG. 1 or 2.

Each group is configured to communicate with the controller 2200 through one common channel. The controller 2200 is configured similarly to the controller 1200 described with reference to FIG. 9. The controller 2200 is configured to control the plurality of memory chips of the semiconductor memory device 2100 through the plurality of channels CH1 to CHk.

In FIG. 10, it has been illustrated that a plurality of semiconductor memory chips are coupled to one channel. However, it will be understood that the storage device 2000 may be modified such that one semiconductor memory chip is coupled to one channel.

Figure 11:
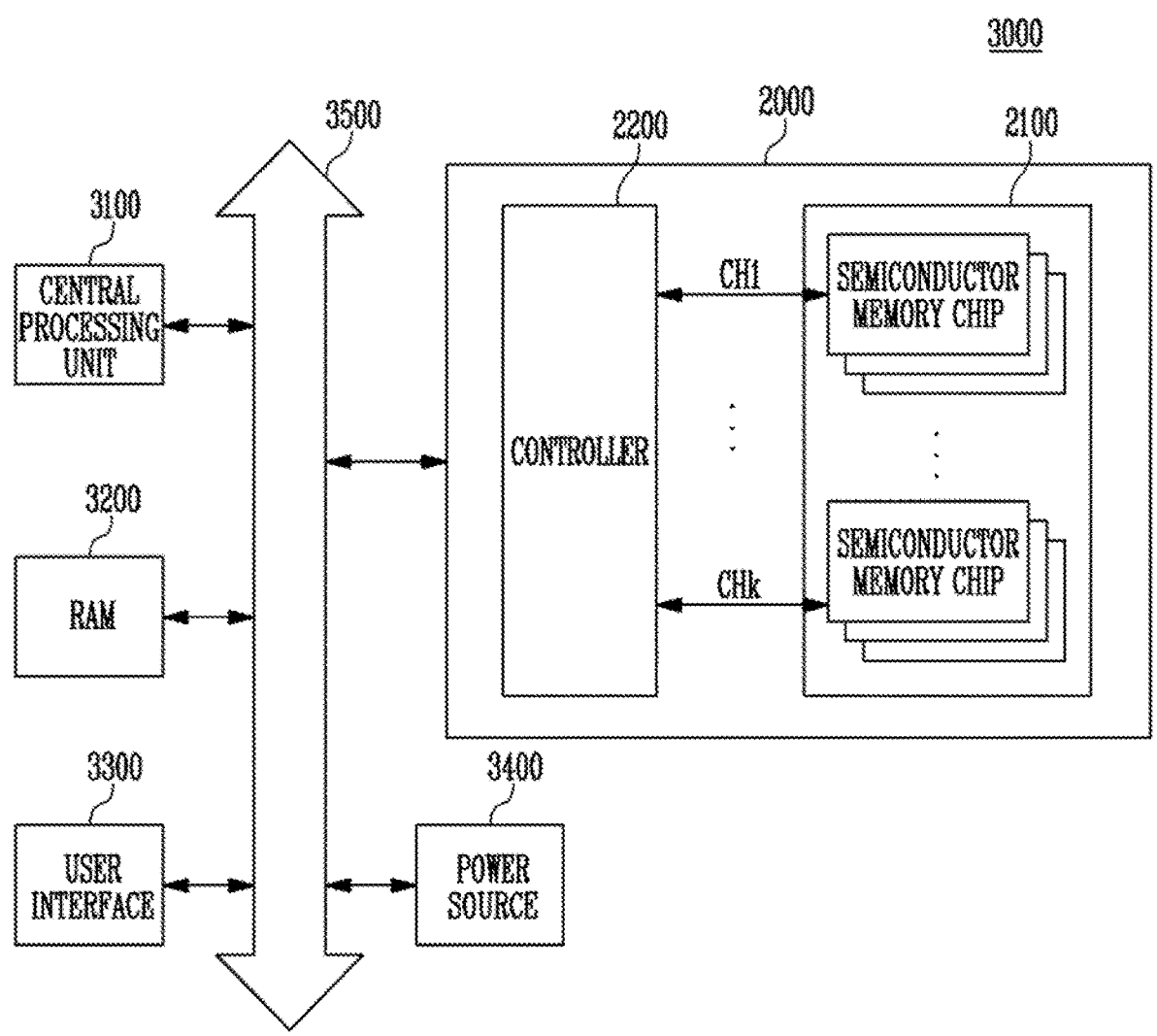
FIG. 11 is a block diagram illustrating a computing system including the storage device described with reference to FIG. 10.

FIG. 11 is a block diagram illustrating a computing system including the storage device 2000 described with reference to FIG. 10.

Referring to FIG. 11, the computing system 3000 includes a central processing unit 3100, a RAM 3200, a user interface 3300, a power source 3400, a system bus 3500, and the storage device 2000.

The storage device 2000 is electrically coupled to the central processing unit 3100, the RAM 3200, the user interface 3300, and the power source 3400 through the system bus 3500. Data supplied through user interface 3300 or data processed by the central processing unit 3100 are stored in the storage device 2000.

In FIG. 11, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 11, it is illustrated that the storage device 2000 described with reference to FIG. 10 is provided. However, the storage device 2000 may be replaced by the storage device 1000 described with reference to FIG. 9. In an embodiment, the computing system 3000 may be configured to include both the storage devices 1000 and 2000 described with reference to FIGS. 9 and 10.

According to the present disclosure, it is possible to provide a memory device that prevents generation of an abnormal column address and an operating method for the memory device.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
a memory cell array; and
a column address controller configured to enable a column address control signal in response to an address signal and generate a column address of the memory cell array in response to the column address control signal,
wherein the address signal, including a column address signal corresponding to the column address, is input during a plurality of cycles of a reference clock of the memory device,
wherein the column address signal is input during at least two cycles among the plurality of cycles, and
wherein the column address control signal is disabled in at least one of the at least two cycles.

2. The memory device of claim 1, wherein the address signal is input during five cycles of the reference clock of the memory device.

3. The memory device of claim 2, wherein the column address signal includes a first column address signal input during a first cycle among the five cycles and a second column address signal input during a second cycle among the five cycles.

4. The memory device of claim 3, wherein the column address controller includes:

an address control signal generator configured to generate an address control signal indicating one among the five cycles corresponding to a currently input address signal of the address signal;

a column address control signal generator configured to generate the column address control signal; and a column address generator configured to generate the column address by using the first column address signal and the second column address signal, wherein the column address control signal generator enables the column address control signal during the second cycle, and wherein the column address generator generates the column address when the column address control signal is enabled.

5. The memory device of claim 4, wherein the column address controller further includes a column address signal storage unit configured to store the first column address signal and the second column address signal.

6. The memory device of claim 4, wherein the column address control signal generator generates the column address control signal when the address control signal indicates the second cycle.

7. The memory device of claim 4, wherein the column address control signal generator generates the column address control signal, based on an internal signal of the memory device that is enabled during only the second cycle.

8. The memory device of claim 2, wherein the address signal further includes signals respectively corresponding to a row address indicating positions of the selected memory cells in a row direction, a logical unit number indicating a unique identification number of the memory device, a plane address indicating a plane to which the selected memory cells belong, and a block address indicating a position of a memory block in which the selected memory cells are included.

9. The memory device of claim 8, wherein the signals respectively corresponding to the row address, the logical unit number, the plane address, and the block address are input during third to fifth cycles among the five cycles.

10. A memory device comprising:
a memory cell array; and
a control logic configured to receive a command signal instructing performance of an operation on selected memory cells among the plurality of memory cells from an external controller and an address signal indicating positions of the selected memory cells,
wherein the control logic includes a column address controller configured to enable a column address control signal in response to the address signal and generate a column address of the memory cell array in response to the column address control signal, which corresponds to a column address signal included in the address signal,
wherein the address signal including the column address signal corresponding to the column address, is input during a plurality of cycles of a reference clock of the memory device,
wherein the column address signal is input during at least two cycles among the plurality of cycles, and
wherein the column address control signal is disabled in the at least one of the at least two cycles.

11. The memory device of claim 10, wherein the address signal is input during five cycles of the reference clock of the memory device.

12. The memory device of claim 11, wherein the column address signal includes a first column address signal input during a first cycle among the five cycles and a second column address signal input during a second cycle among the five cycles.

13. The memory device of claim 12, wherein the column address controller includes:

an address control signal generator configured to generate an address control signal indicating one among the five cycles corresponding to a currently input address signal of the address signal;

a column address control signal generator configured to generate the column address control signal; and a column address generator configured to generate the column address by using the first column address signal and the second column address signal, wherein the column address control signal generator enables the column address control signal during the second cycle, and wherein the column address generator generates the column address when the column address control signal is enabled.

14. The memory device of claim 13, wherein the column address controller further includes a column address signal storage unit configured to store the first column address signal and the second column address signal.

15. The memory device of claim 13, wherein the column address control signal generator generates the column address control signal when the address control signal indicates the second cycle.

16. The memory device of claim 13, wherein the column address control signal generator generates the column address control signal, based on an internal signal of the memory device that is enabled during only the second cycle.

17. The memory device of claim 11, wherein the address signal further includes signals respectively corresponding to a row address indicating positions of the selected memory cells in a row direction, a logical unit number indicating a unique identification number of the memory device, a plane address indicating a plane to which the selected memory cells belong, and a block address indicating a position of a memory block in which the selected memory cells are included.

18. The memory device of claim 17, wherein the signals respectively corresponding to the row address, the logical unit number, the plane address, and the block address are input during third to fifth cycles among the five cycles.

* * * * *